United States Patent
Sato et al.

(10) Patent No.: US 7,800,365 B2
(45) Date of Patent: Sep. 21, 2010

(54) MAGNETIC DETECTION DEVICE AND ELECTRICAL PRODUCT

(75) Inventors: Kiyoshi Sato, Niigata-ken (JP); Hideto Ando, Niigata-ken (JP); Hideki Gochou, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/623,029

(22) Filed: Nov. 20, 2009

(65) Prior Publication Data
US 2010/0066359 A1    Mar. 18, 2010

Related U.S. Application Data

(63) Continuation of application No. PCT/JP2008/060558, filed on Jun. 9, 2008.

(30) Foreign Application Priority Data

Jun. 11, 2007    (JP)    ............................. 2007-153695

(51) Int. Cl.
*G01R 33/04* (2006.01)
(52) U.S. Cl. ...................................... 324/260; 324/252
(58) Field of Classification Search ................. 324/252, 324/260
See application file for complete search history.

(56) References Cited

U.S. PATENT DOCUMENTS

| | | | |
|---|---|---|---|
| 4,628,259 A | 12/1986 | Takahashi et al. | |
| 4,677,380 A | 6/1987 | Popovic et al. | |
| 6,100,680 A * | 8/2000 | Vig et al. | ................. 324/207.2 |
| 6,242,908 B1 * | 6/2001 | Scheller et al. | .......... 324/207.2 |
| 2009/0174401 A1 * | 7/2009 | Takeda | ........................ 324/251 |

FOREIGN PATENT DOCUMENTS

| | | |
|---|---|---|
| JP | 2000-180206 A | 6/2000 |
| JP | 2003-14834 A | 1/2003 |
| JP | 2003-262665 A | 9/2003 |
| JP | 2004-180286 A | 6/2004 |

* cited by examiner

*Primary Examiner*—Jay M Patidar
(74) *Attorney, Agent, or Firm*—Brinks Hofer Gilson & Lione

(57) ABSTRACT

An integrated circuit is provided with two output terminals and a mode switch circuit which includes a pair of switch terminals. The mode switch circuit is allowed to switch the output mode between the 1-output mode for outputting the (+) magnetic field detection signal and the (−) magnetic field detection signal from the output terminal, and the 2-output mode for outputting the (+) magnetic field signal from the output terminal as one of the output terminals, and the (−) magnetic field detection signal from the output terminal as the other output terminal in accordance with the shortcircuit state or the non-shortcircuit state between the switch terminals. The switch terminals are exposed on the surface of the device, and the shortcircuit state and the non-shortcircuit state may be externally adjusted.

5 Claims, 9 Drawing Sheets

MAGNETIC DETECTION DEVICE AND ELECTRICAL PRODUCT

RELATED APPLICATIONS

This application claims benefit of the Japanese Patent Application No. 2007-2050 filed on Jun. 11, 2007, which is hereby incorporated by reference.

BACKGROUND OF THE INVENTION

1. Field of the Invention

The present invention relates to a magnetic detection device which is capable of conducting bipolar detection, and particularly, to a magnetic detection device capable of switching among plural output modes, and an electrical product using the magnetic detection device.

2. Description of the Related Art

A magnetic detection device (magnetic sensor) provided with a magnetoresistive effect element may be employed for detecting open/close state of an electrical product such as a folding mobile phone and a refrigerator.

The electric resistance value of the magnetoresistive effect element changes in accordance with the external magnetic field intensity. It is therefore possible to detect intensity level of the external magnetic field applied to the magnetic detection device based on the voltage change resulting from the resistance change.

The magnetic detection device is controlled in one of output modes including a bipolar 2-output mode for detecting bipolar of the external magnetic field in (+) direction and the external magnetic field in (−) direction opposite the (+) direction to output a (+) magnetic field detection signal and a (−) magnetic field detection signal from the respective output terminals, a bipolar 1-output mode for detecting the bipolar as described above to output the (+) magnetic field detection signal and the (−) magnetic field detection signal from a common output terminal, and a single-pole 1-output mode for detecting only one of the external magnetic fields in (+) direction and (−) direction to output one of the (+) magnetic field detection signal and the (−) magnetic field detection signal. Depending on individual electrical product or the required function for the electrical product, the desired output mode may differ.

Generally, the aforementioned three output modes cannot be obtained from the single magnetic detection device. The magnetic detection devices each for the different output mode have to be manufactured separately, resulting in the cost increase.

Any of Patent Documents such as Japanese Unexamined Patent Application Publication Nos. 2000-180206, 59-5976, and 2004-180286 does not disclose the structure which allows the common magnetic detection device to provide the three output modes as described above.

SUMMARY OF THE INVENTION

The present invention provides a magnetic detection device capable of easily switching among plural output modes, and an electrical product using the magnetic detection device.

The present invention provides a magnetic detection device provided with a sensor unit which changes an electrical characteristic in accordance with change in each magnetic field intensity of external magnetic fields in (+) direction and (−) direction opposite the (+) direction, and an integrated circuit which is connected to the sensor unit for generating and outputting a (+) magnetic field detection signal and a (−) magnetic field detection signal based on the change in the electrical characteristic. The integrated circuit is provided with two output terminals and a mode switch circuit which includes a pair of switch terminals. The mode switch circuit is capable of switching between a 1-output mode for outputting the (+) and (−) magnetic field detection signals from one of the output terminals and a 2-output mode for outputting the (+) magnetic field detection signal from the one of the output terminal and the (−) magnetic field detection signal from the other output terminal, respectively depending on a shortcircuit state or a non-shortcircuit state between the switch terminals. The shortcircuit state and the non-shortcircuit state are allowed to be externally adjusted.

The magnetic detection device according to the present invention is capable of switching the output mode between 1-output mode and 2-output mode, which may eliminate the need of manufacturing different magnetic detection devices for providing the respective output modes. The output mode may be switched by externally adjusting the switch terminal into shortcircuit state or non-shortcircuit state, resulting in easy switching of the output mode.

In the present invention, preferably the switch terminal is exposed on a surface of the device, and is adjusted into the shortcircuit state or the non-shortcircuit state based on an electrically coupled state or an electrically decoupled state between the switch terminals.

In the present invention, preferably an operation member having a surface opposite the switch terminals formed of a conductive material is exposed on the surface of the device, and operated to adjust the switch terminals into the shortcircuit state via the operation member or the non-shortcircuit state having the operation member apart from the switch terminals.

This makes it possible to easily switch the output mode between the 1-output mode and the 2-output mode.

In the present invention, preferably the sensor unit includes a first circuit for detecting a (+) magnetic field, which is provided with a first magnetoresistive effect element using a magnetoresistive effect having an electric resistance changed based on the change in the magnetic field intensity of the external magnetic field in the (+) direction, and a second circuit for detecting a (−) magnetic field, which is provided with a second magnetoresistive effect element using the magnetoresistive effect having the electric resistance changed based on the change in the magnetic field intensity of the external magnetic field in the (−) direction. The sensor unit may be appropriately formed to be adapted to the bipolar detection.

The present invention provides an electrical product which contains the magnetic detection device as described above, which is formed to have one of a structure in which the magnetic detection device is adjusted to the 1-output mode, and an output terminal for outputting the (+) magnetic field detection signal and the (−) magnetic field detection signal is connected to a circuit substrate in the product, a structure in which the magnetic detection device is adjusted to the 2-output mode, and an output terminal for outputting the (+) magnetic field detection signal and the output terminal for outputting the (−) magnetic field detection signal are connected to the circuit substrate of the product, and a structure in which the magnetic detection device is adjusted to the 2-output mode, and only one of the output terminals for outputting the (+) magnetic field detection signal and the (−) magnetic field detection signal is connected to the circuit substrate in the product.

The electrical product is allowed to be operated in the desired output mode selectable from the bipolar 1-output mode, the bipolar 2-output mode, and the single-pole 1-output mode using the single magnetic detection device.

The magnetic detection device according to the present invention is structured to switch between the 1-output mode and 2-output mode, thus eliminating the need of manufacturing the magnetic detection devices for providing the respective output modes. The output mode switching operation may be performed by externally adjusting the switch terminal into the shortcircuit state or the non-shortcircuit state. This makes it possible to easily switch the output mode.

The single magnetic detection device as described above is built in the electrical product so as to be easily operated in the desired output mode selectable from the bipolar 1-output mode, the bipolar 2-output mode, and the single-pole 1-output mode using the single magnetic detection device.

DESCRIPTION OF THE PREFERRED EMBODIMENTS

Figure 1:
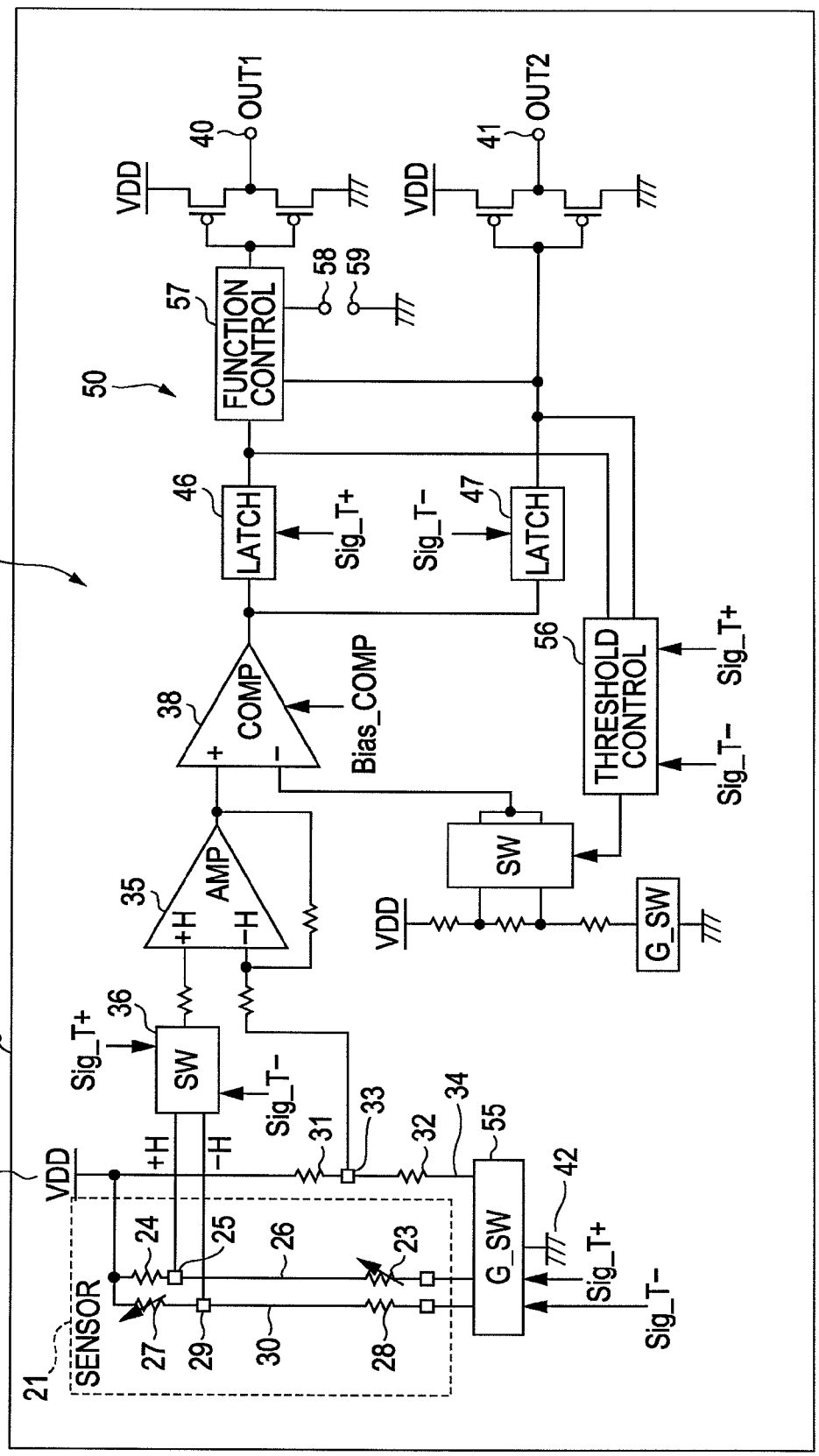
FIG. 1 is an entire circuit diagram showing a structure of a magnetic detection device according to an embodiment.
Figure 5:
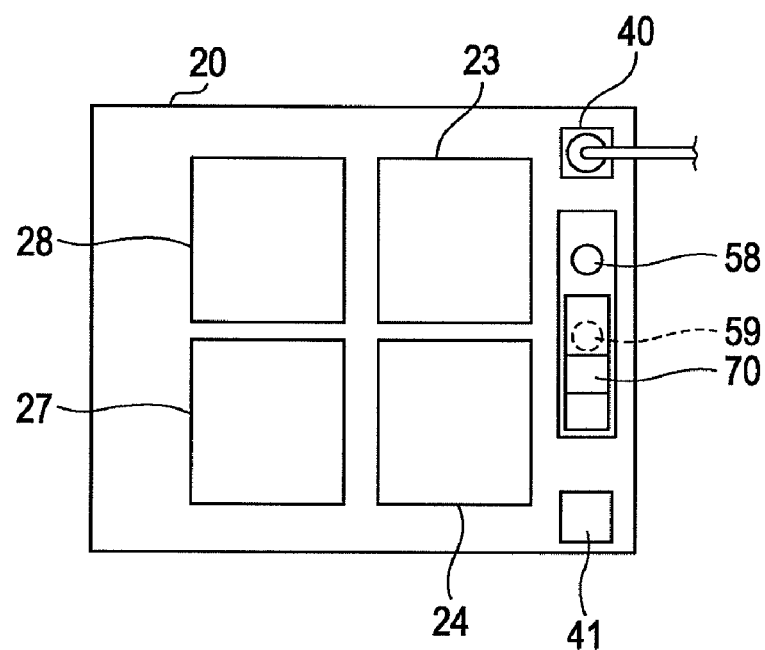
FIG. 5 is a plan view illustrating the magnetic detection device installed in the electrical product in an output mode with the structure different from those shown in FIGS. 2 to 4.
Figure 6:
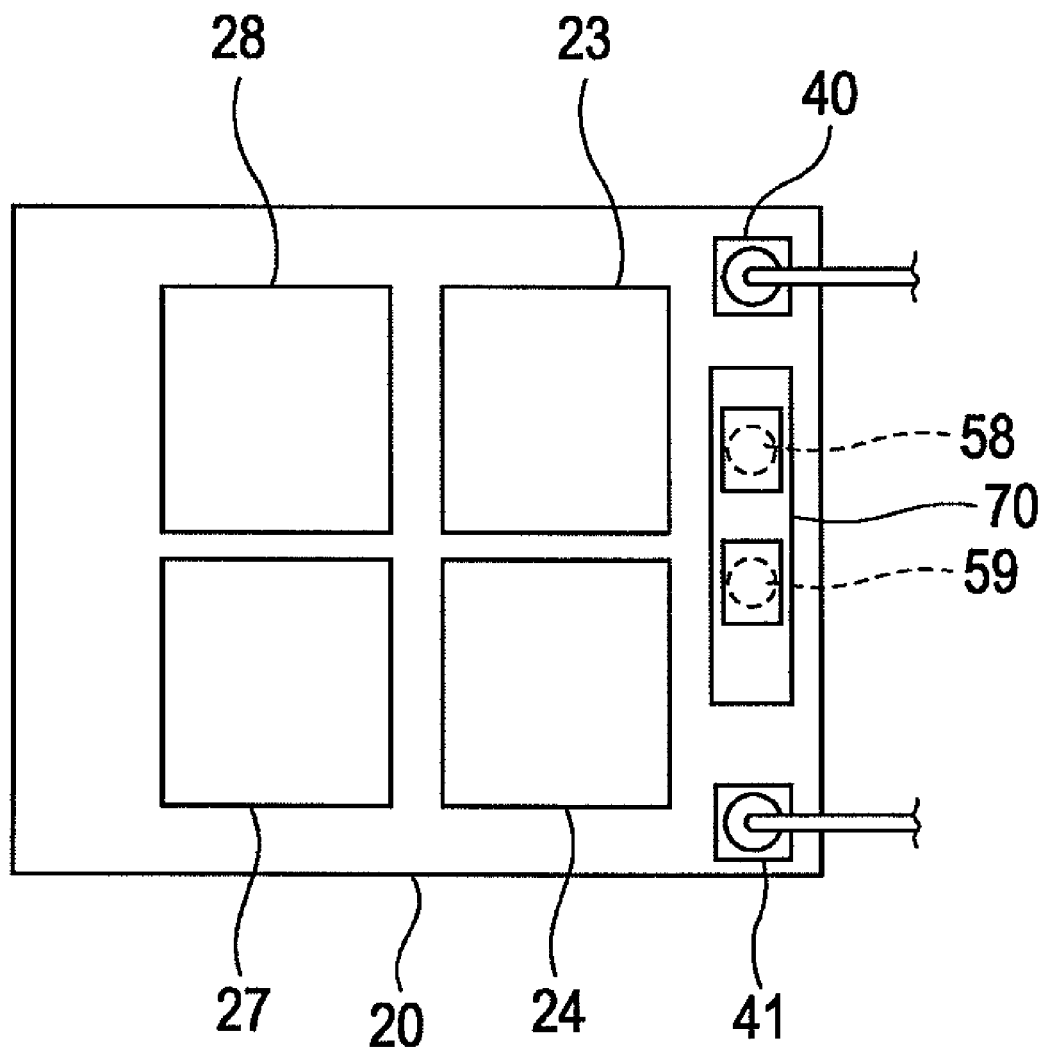
FIG. 6 is a plan view illustrating the magnetic detection device installed in the electrical product in the output mode with the structure different from those shown in FIGS. 2 to 4.
Figure 7:
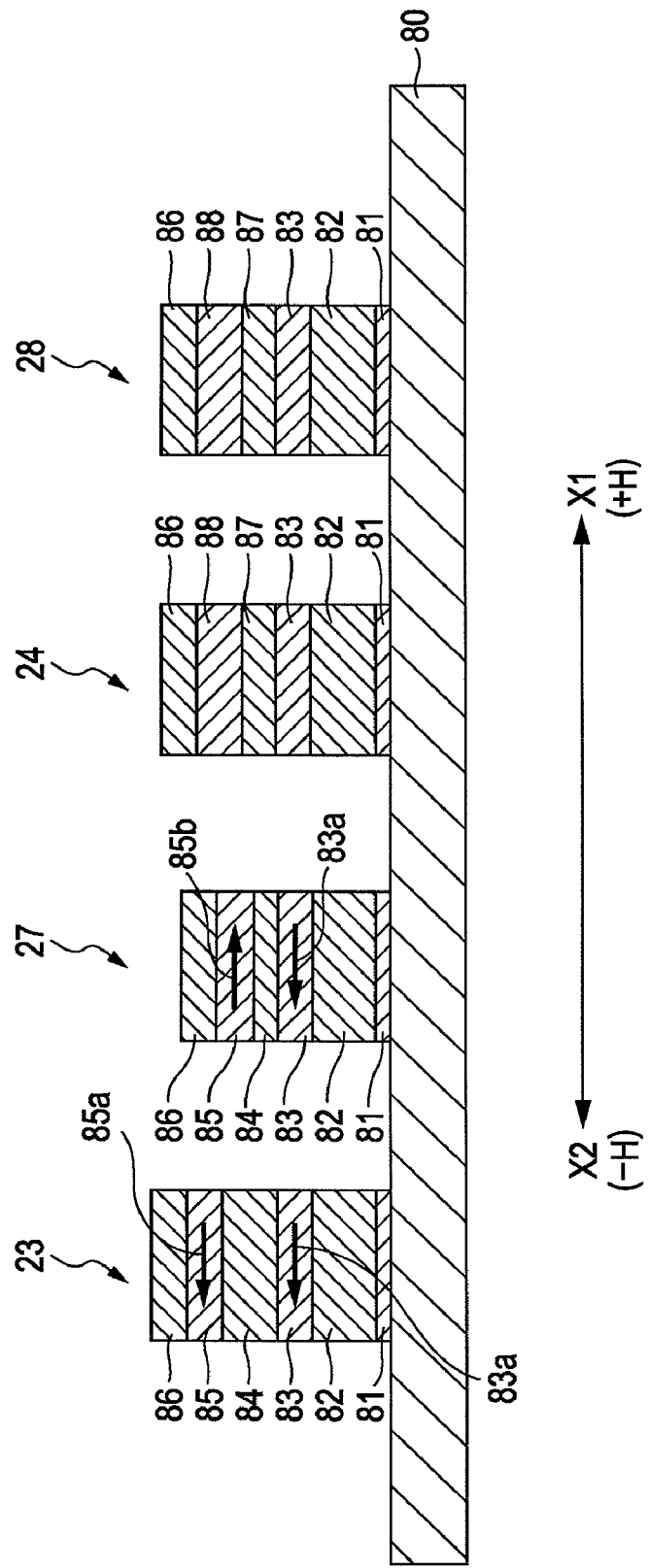
FIG. 7 is a partially sectional view illustrating each layer structure of a first magnetoresistive effect element, a second magnetoresistive effect element, a first fixed resistance element and a second fixed resistance element.
Figure 8:
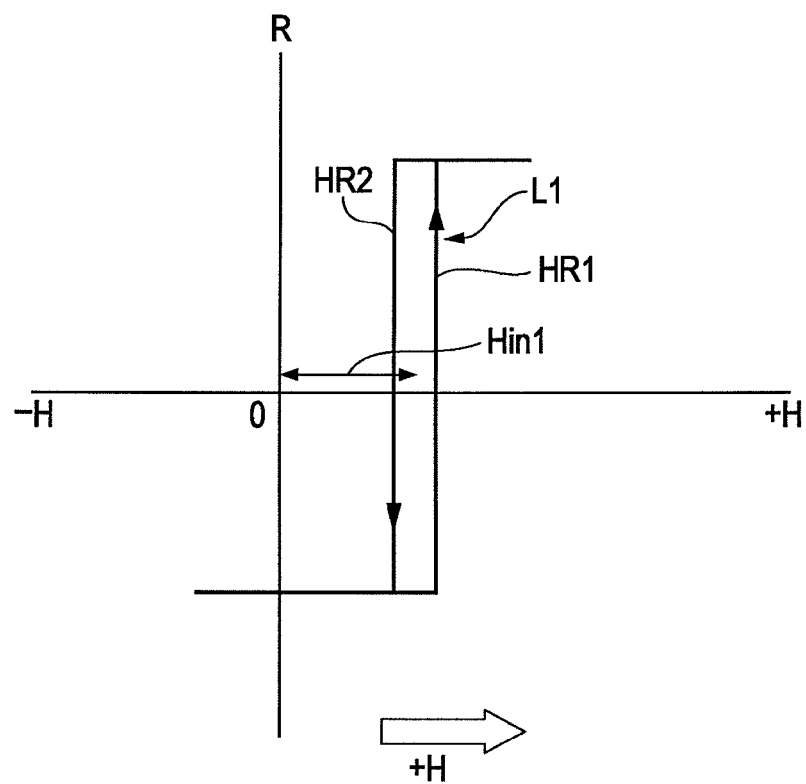
FIG. 8 is a graph for explaining a curve R-H of the first magnetoresistive effect element.
Figure 9:
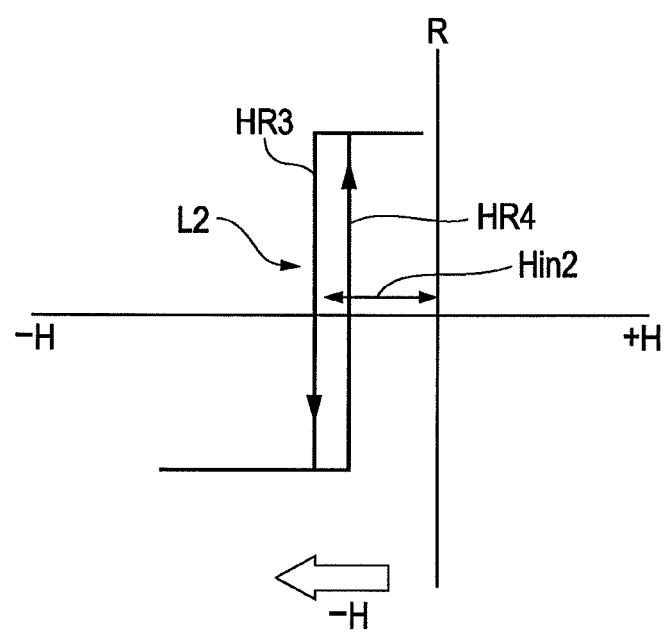
FIG. 9 is a graph for explaining a curve R-H of the second magnetoresistive effect element.
Figure 10:
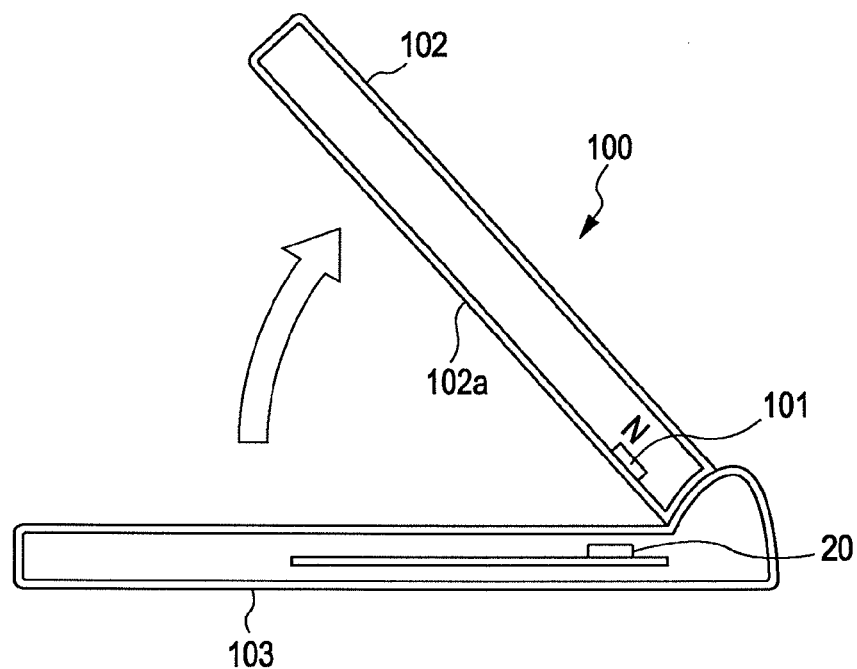
FIG. 10 is an explanatory view of an embodiment with respect to usage of the magnetic detection device of the embodiment (partially illustrating a folding mobile phone which contains the magnetic detection device in an opened state)
Figure 11:
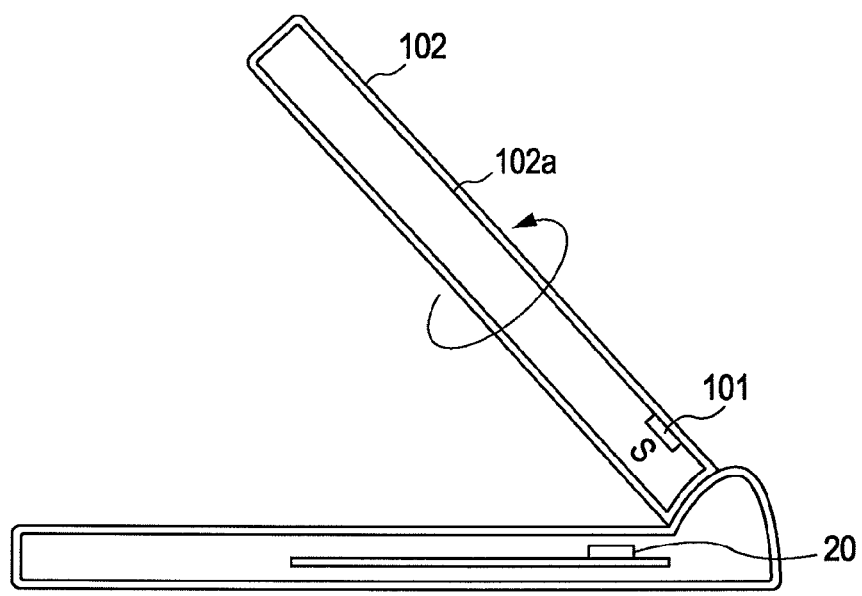
FIG. 11 is an explanatory view of an embodiment with respect to usage of the magnetic detection device of the embodiment (partially illustrating the folding mobile phone which contains the magnetic detection device while having the first member turned over)
Figure 12:
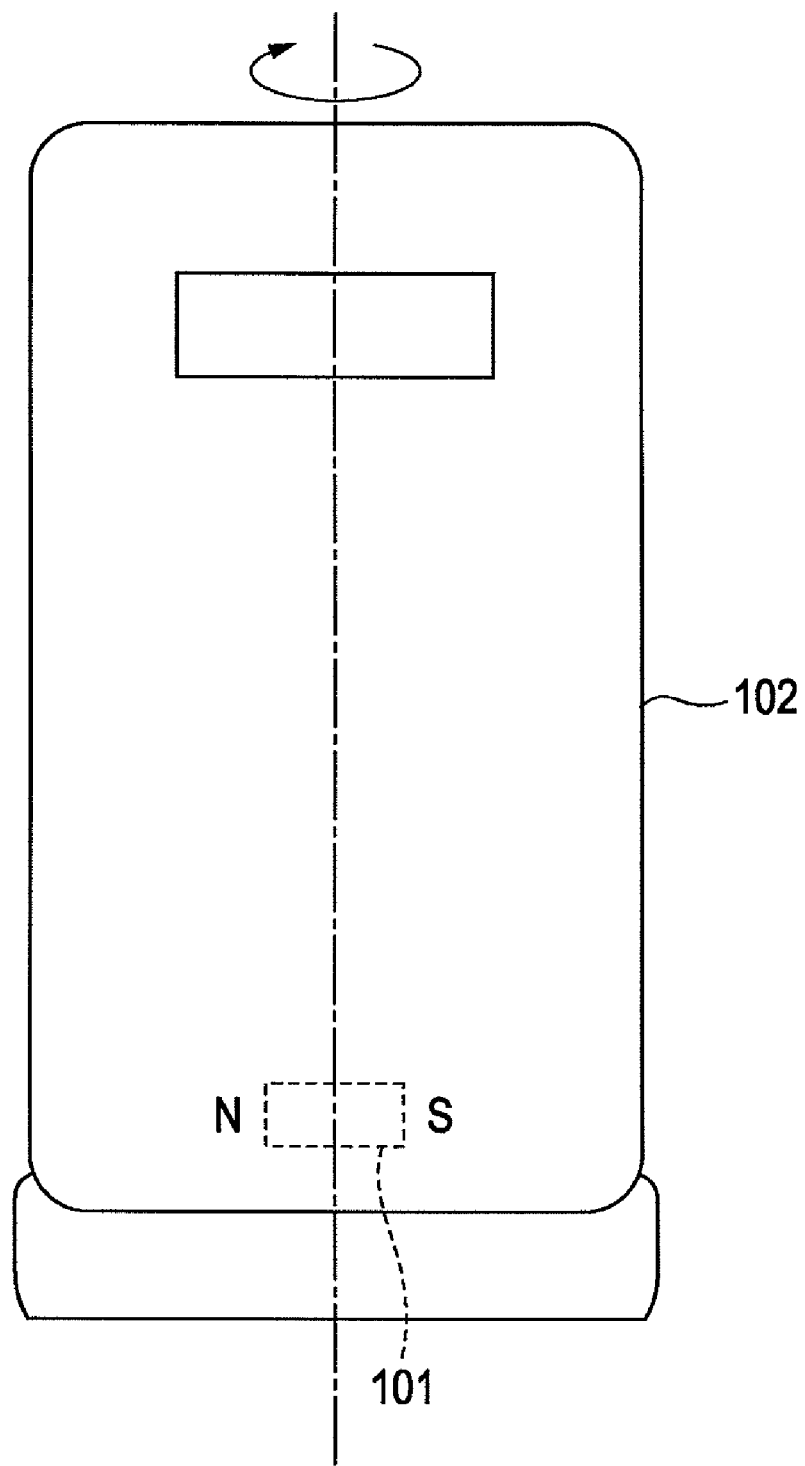
FIG. 12 is an explanatory view of an embodiment with respect to usage of the magnetic detection device of the embodiment (plan view partially illustrating the folding mobile phone which contains the magnetic detection device as illustrated in FIG. 10)
Figure 13:
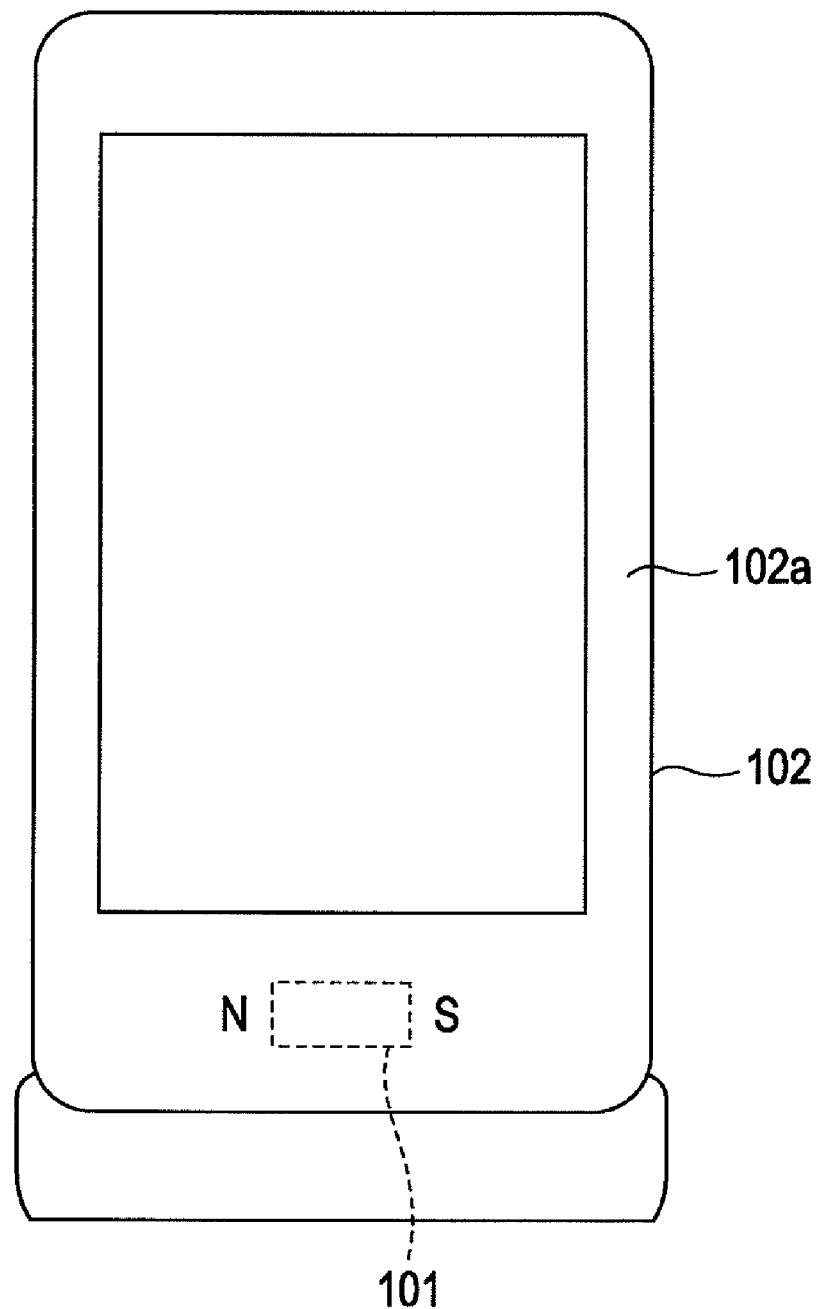
FIG. 13 is an explanatory view of an embodiment with respect to usage of the magnetic detection device of the embodiment (plan view partially illustrating the folding mobile phone which contains the magnetic detection device as illustrated in FIG. 11).

FIG. 1 is an entire circuit diagram illustrating a magnetic detection device 20 according to an embodiment. FIGS. 2 to 6 are plan views each showing the magnetic detection device 20 of the embodiment installed in the electrical product in the respective output modes. FIG. 7 is a sectional view partially illustrating each layer structure of a first magnetoresistive effect element, a second magnetoresistive effect element, a first fixed resistance element and a second fixed resistance element according to the embodiment. FIG. 8 illustrates a curve R-H of the first magnetoresistive effect element. FIG. 9 illustrates a curve R-H of the second magnetoresistive effect element. FIGS. 10 and 11 are sectional views each illustrating a folding mobile phone having the magnetic detection device installed therein as examples for explaining usage of the magnetic detection device of the embodiment. FIGS. 12 and 13 are plan views each illustrating the folding mobile phone.

The magnetic detection device 20 of the embodiment shown in FIG. 1 includes a sensor unit 21 and an integrated circuit (IC) 22.

The sensor unit 21 includes a first series circuit 26 having a first magnetoresistive effect element 23 and a first fixed resistance element 24 connected in series via a first output extraction unit 25, and a second series circuit 30 having a second magnetoresistive effect element 27 and a second fixed resistance element 28 connected in series via a second output extraction unit 29.

Referring to the structure shown in FIG. 1, the integrated circuit 22 is provided with a third series circuit 34 having a third fixed resistance element 31 and a fourth fixed resistance element 32 connected in series via a third output extraction unit 33.

The third series circuit 34 forms bridge circuits with the first series circuit 26 and the second series circuit 30 as a common circuit. Hereinafter, the bridge circuit formed by connecting the first series circuit 26 and the third series circuit 34 in parallel will be referred to as a first bridge circuit (first circuit unit), and the bridge circuit formed by connecting the second series circuit 30 and the third series circuit 34 in parallel will be referred to as a second bridge circuit (second circuit unit).

Referring to FIG. 1, in the first bridge circuit, the first magnetoresistive effect element 23 is connected to the fourth fixed resistance element 32 in parallel, and the first fixed resistance element 24 is connected to the third fixed resistance element 31 in parallel. In the second bridge circuit, the second magnetoresistive effect element 27 is connected to the third fixed resistance element 31 in parallel, and the second fixed resistance element 28 is connected to the fourth fixed resistance element 32 in parallel.

Referring to FIG. 1, the integrated circuit 22 is provided with an input terminal (power source) 39, a ground terminal 42, and two external output terminals 40 and 41.

Referring to FIG. 1, the integrated circuit 22 is provided with a single differential amplifier 35 to which the third output extraction unit 33 of the third series circuit 34 is connected.

Meanwhile, the first output extraction unit 25 of the first series circuit 26 and the second output extraction unit 29 of the second series circuit 30 are connected to an input unit of a switch circuit 36, respectively. An output unit of the switch circuit 36 is connected to an input unit of the differential amplifier 35.

Referring to FIG. 1, an output unit of the differential amplifier 35 is connected to a comparator 38 of Schmitt trigger type, and an output unit of the comparator 38 is further connected to a first latch circuit 46 and a second latch circuit 47. Output units of the latch circuits 46 and 47 are connected to the first external output terminal 40 and the second external output terminal 41, respectively.

Referring to FIG. 1, a mode switch circuit 50 is interposed between the latch circuits 46, 47 and the external output terminals 40, 41.

The integrated circuit 22 is provided with a not shown clock circuit. The clock signal from the clock circuit is time divided into a first clock signal (Sig T+) and a second clock signal (Sig T−) at a considerably short cycle so as to be input into the respective switch circuits 36, 55, the latch circuits 46, 47, and a threshold control circuit 56.

When the first clock signal (Sig T+) is input, the first output extraction unit 25 is connected to the differential amplifier 35 via the switch circuit 36, and the first bridge circuit is connected to the ground terminal 42 via the switch circuit 55. The first clock signal (Sig T+) is input to the first latch circuit 46 such that a magnetic field detection signal ((+) magnetic field detection signal) generated based on the change in the electric characteristic of the first bridge circuit is retained in the first latch circuit 46.

When the second clock signal (Sig T−) is input, the second output extraction unit 29 is connected to the differential amplifier 35 via the switch circuit 36, and the second bridge circuit is connected to the ground terminal 42 via the switch circuit 55. The second clock signal (Sig T−) is input to the second latch circuit 46 such that the magnetic field signal ((−) magnetic field detection signal) generated based on the change in the electric characteristic in the second bridge circuit is retained in the second latch circuit 47.

The (+) magnetic field detection signal is a detection signal corresponding to the change in the magnetic field intensity of the external magnetic field H in (+) direction. For example, such signal is controlled to be generated when the differential potential from the differential amplifier 35 based on the change in the magnetic field intensity of the external magnetic field H in (+) direction exceeds a predetermined threshold level generated in case of the first clock signal (Sig T+) in the threshold control circuit 56. The (−) magnetic field detection signal is a detection signal corresponding to the change in the magnetic field intensity of the external magnetic field H in (−) direction. For example, such signal is controlled to be generated when the differential potential from the differential amplifier 35 based on the change in the magnetic field intensity of the external magnetic field H in (−) direction exceeds the predetermined threshold level generated in case of the second clock signal (Sig T−) in the threshold control circuit 56. In this way, the magnetic detection device 20 of the embodiment is capable of generating both the (+) and (−) magnetic field detection signals.

The mode switch circuit 50 shown in FIG. 1 is formed of a function control circuit 57 which includes a logic circuit, and a pair of switch terminals 58, 59.

Figure 2:
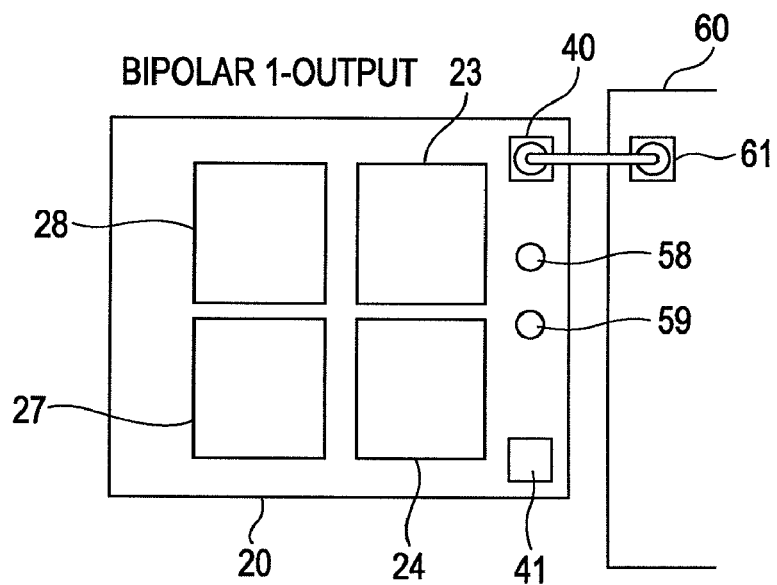
FIG. 2 is a plan view illustrating the magnetic detection device installed in the electrical product in an output mode.

Referring to FIG. 2, the external output terminals 40, 41, and the switch terminals 58, 59 are exposed on the surface of the magnetic detection device 20. FIG. 2 illustrates the first magnetoresistive effect element 23, the second magnetoresistive effect element 27, the first fixed resistance element 24 and the second fixed resistance element 28. Actually, those elements are formed on the surface of the magnetic detection device 20 in a meander form.

The input terminal 39 and the ground terminal 42 are exposed on the surface of the magnetic detection device 20 although they are not shown in FIG. 2.

In the structure shown in FIG. 2, the switch terminals 58 and 59 are in the non-shortcircuit state. In this state, the mode switch circuit 50 allows both the (+) magnetic field detection signal and (−) magnetic field detection signal to be output from the first external output terminal 40. The (−) magnetic field detection signal is output from the second external output terminal 41 as well.

Referring to FIG. 2, in the state where the magnetic detection device 20 is installed in the electrical product, a first input terminal 61 on a circuit substrate 60 in the electrical product and the first external output terminal 40 are electrically coupled through wire bonding, for example so as to operate the electrical product in the bipolar 1-output mode. In the bipolar 1-output mode, each change in the magnetic field intensity of the external magnetic fields H both in (+) and (−) directions may be detected. However, both the magnetic field detection signals are output only from the external output terminal 40. The direction of the external magnetic field H cannot be detected.

Figure 3:
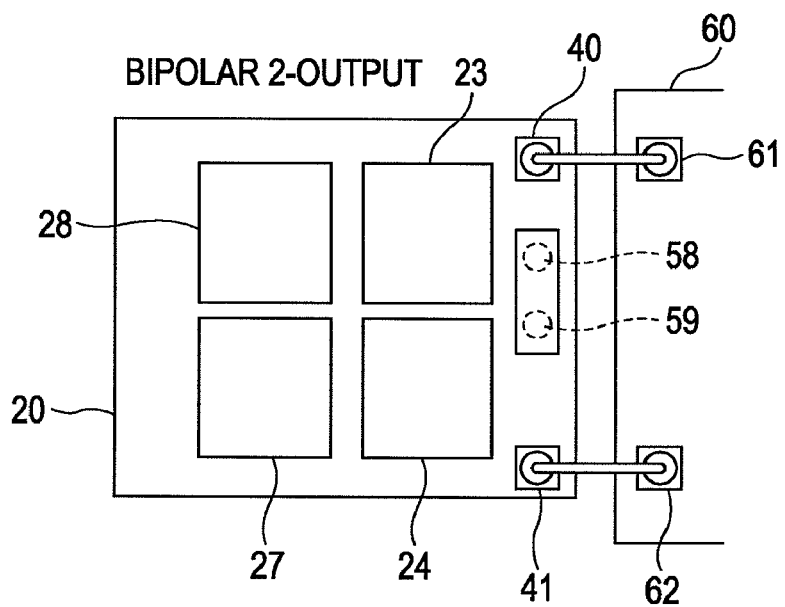
FIG. 3 is a plan view illustrating the magnetic detection device installed in the electrical product in another output mode.

Meanwhile, in the structure shown in FIG. 3, the switch terminals 58 and 59 are in the shortcircuit state. The switch terminals 58 and 59 are electrically coupled through a known method such as wire bonding, soldering and plating.

The switch terminals 58 and 59 are brought into the short-circuit state such that the mode switch circuit 50 allows the (+) magnetic field detection signal to be output from the first external output element 40, and the (−) magnetic field detection signal to be output from the second external output terminal 41, respectively.

Referring to FIG. 3, when the aforementioned magnetic detection device 20 is installed in the electrical product, the first input terminal 61 on the circuit substrate 60 in the electrical product and the first external output terminal 40 are electrically coupled through the wire bonding, and a second input terminal 62 and the second external output terminal 41 are electrically coupled through the wire bonding. This makes it possible to operate the electrical product in the bipolar 2-output mode. In the bipolar 2-output mode, each change in the magnetic field intensity of the external magnetic field in (+) and (−) directions may be detected, and (+) and (−) magnetic field detection signals may be output from the respective external output terminals 40 and 41, separately. This makes it possible to detect the direction of the external magnetic field H.

Figure 4:
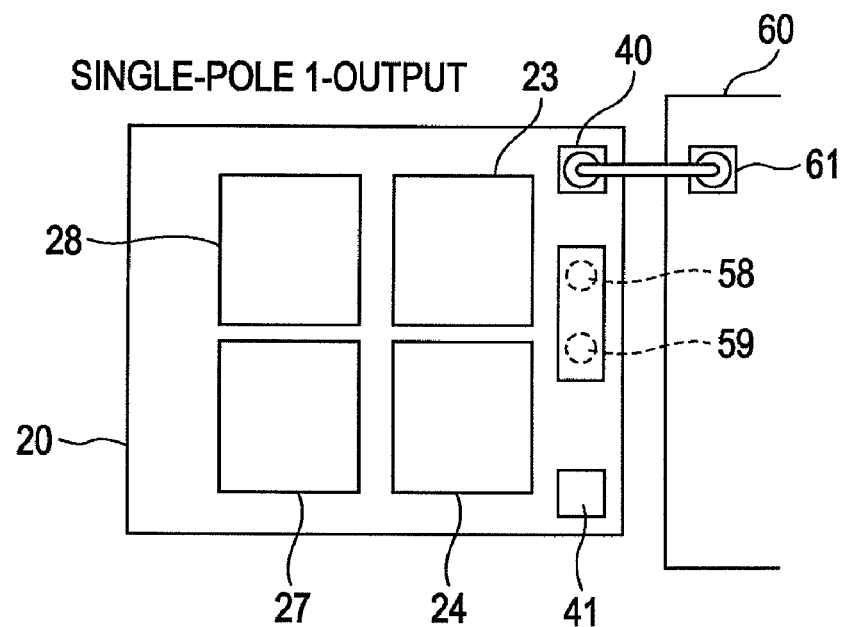
FIG. 4 is a plan view illustrating the magnetic detection device installed in the electrical product in another output mode.

Meanwhile, the switch terminals 58 and 59 are brought into the shortcircuit state to allow the magnetic detection device 20 capable of outputting the (+) magnetic field detection signal from the first external output terminal 40, and the (−) magnetic field detection signal from the second external output terminal 41 to be installed in the electrical product as shown in FIG. 4. Unlike the case shown in FIG. 3, the electrical product may be operated in the single-pole 1-output mode in the case where the first external output terminal 40 is only coupled with the first input terminal 61 in the electrical product, and the second external output terminal 41 and the second input terminal 62 are not electrically coupled. In the single-pole 1-output mode, the change in the magnetic field intensity of any one of the external magnetic fields H in the (+) direction and the (−) direction may only be detected.

When the magnetic detection device 20 according to the embodiment is in the initial state (immediately after manufacturing of the magnetic detection device 20, or in the state before adjusting the switch terminals 58 and 59 into the shortcircuit state or non-shortcircuit state conforming to the required output mode for the electrical product), the switch terminals 58 and 59 are in the non-shortcircuit state as shown in FIG. 2. In the case where the magnetic detection device 20 is installed in the electrical product and used in the bipolar 1-output mode, the first external output terminal 40 and the first input terminal 61 in the electrical product may be electrically coupled as shown in FIG. 2.

Meanwhile, in case of the use in the bipolar 2-output mode or the single-pole 1-output mode as shown in FIGS. 3 and 4, the switch terminals 58 and 59 are brought into the shortcircuit state, and the external output terminal and the input terminal in the product are electrically coupled before or after installation of the magnetic detection device 20 in the electrical product.

In the initial state, the magnetic detection device 20 according to the embodiment may be manufactured while having the switch terminals 58 and 59 brought into the shortcircuit state as shown in FIGS. 3 and 4. At this time, in the case where the magnetic detection device 20 is installed in the electrical product to be used in the bipolar 2-output mode or the single-pole 1-output mode, the external output terminal and the first input terminal in the product may be electrically coupled as shown in FIGS. 3 and 4.

Meanwhile, in case of the use in the bipolar 1-output mode, before or after installation of the magnetic detection device 20 in the electrical product, the shortcircuit state between the switch terminals 58 and 59 is cut into the non-shortcircuit state, and the first external output terminal 40 and the first input terminal 61 in the product are electrically coupled. If the switch terminals 58 and 59 are electrically coupled with wire, the wire may be cut using tool.

Referring to FIG. 1, when the switch terminals 58 and 59 are in the non-shortcircuit state, the mode switch circuit 50 serves to adjust both the (+) magnetic field detection signal and (−) magnetic field detection signal to be output from the first external output terminal 40 (1-output mode). When the switch terminals 58 and 59 are in the shortcircuit state, the mode switch circuit 50 serves to adjust the (+) magnetic field detection signal to be output from the first external output terminal 40, and the (−) magnetic field detection signal to be output from the second external output terminal 41, respectively (2-output mode). The mode switch circuit 50 may be operated to adjust the (+) magnetic field detection signal to be output from the first external output terminal 40, and the (−) magnetic field detection signal to be output from the second external output terminal 41, respectively (2-output mode) when the switch terminals 58 and 59 are in the non-shortcircuit state, and the (+) magnetic field detection signal and the (−) magnetic field detection signal to be output from the first external output terminal 40 (1-output mode) when the switch terminals 58 and 59 are in the shortcircuit state by changing the logic circuit for forming the mode switch circuit 50.

In the aforementioned case, in the initial state, when the magnetic detection device 20 according to the embodiment is manufactured while having the switch terminals 58 and 59 held in the shortcircuit state, the mode is set to the 1-output mode. The first external output terminal 40 and the first input terminal 61 in the electrical product are electrically coupled for operating the electrical product in the bipolar 1-output mode likewise the case shown in FIG. 2.

Meanwhile, before or after installation of the magnetic detection device 20 in the electrical product, the electric coupling between the switch terminals 58 and 59 is cut into the non-shortcircuit state, and the external output terminal and the input terminal in the product are electrically coupled to allow the electrical product to be operated in the bipolar 2-output mode or the single-pole 1-output mode in the same way as in the cases shown in FIGS. 3 and 4.

In the initial state, when the magnetic detection device 20 is manufactured while having the switch terminals 58 and 59 held in the non-shortcircuit state, the mode is set to the 2-output mode as described above. Then the external output terminal and the input terminal in the product are electrically coupled likewise the cases shown in FIGS. 3 and 4 to allow the electrical product to be operated in the bipolar 2-output mode or the single-pole 1-output mode.

Meanwhile, before or after installation of the magnetic detection device 20 in the electrical product, the switch terminals 58 and 59 are brought into the shortcircuit state, and the first external output terminal 40 and the first input terminal 61 in the product are electrically coupled to allow the electrical product to be operated in the bipolar 1-output mode likewise the case shown in FIG. 2.

Referring to FIGS. 2 to 4, the switch terminals 58 and 59 are brought into the shortcircuit state through the wire bonding, and the non-shortcircuit state through the wire cutting. A metal slide member (operation member) 70 with at least the surface opposite the switch terminals 58 and 59 slidable in the arrangement direction thereof may be provided as shown in FIG. 5 so as to easily adjust the shortcircuit state or the non-shortcircuit state between the switch terminals 58 and 59 via the slide member 70. FIG. 5 illustrates the non-shortcircuit state between the switch terminals 58 and 59, and FIG. 6 illustrates the shortcircuit state between the switch terminals 58 and 59.

Instead of the slide member, a press button (operation member) may be provided on the switch terminals 58 and 59. When pressing the button, the switch terminals 58 and 59 are brought into the shortcircuit state via the button. Upon release of the button, the switch terminals 58 and 59 are brought into the non-shortcircuit state.

The structure provided with the operation member on the switch terminals 58 and 59 allows the shortcircuit state and the non-shortcircuit state between the switch terminals 58 and 59 to be easily switched frequently.

The operation member may be exposed on the surface of the electrical product to allow user of the electrical product to easily operate the operation member. The user is further allowed to arbitrarily select from the plural modes for operating the product.

In the embodiment, the integrated circuit 22 is provided with the mode switch circuit 50 which includes two external output terminals 40 and 41, and a pair of the switch terminals 58 and 59, and is allowed to switch the output mode between the 1-output mode for outputting the (+) and (−) magnetic field detection signals from the first external output terminal 40, and the 2-output mode for outputting the (+) and (−) magnetic field detection signals from the first external output terminal 40 and the second external output terminal 41, respectively depending on the shortcircuit state or the non-shortcircuit state between the switch terminals 58 and 59. For example, the switch terminals 58 and 59 are exposed on the surface of the device as shown in FIGS. 2 to 4 so as to allow the shortcircuit state and the non-shortcircuit state to be externally adjusted.

The magnetic detection device 20 according to the embodiment is allowed to switch between the 1-output mode and the 2-output mode, and accordingly, individual magnetic detection devices for providing the respective output modes do not have to be produced. Especially, the output mode may be switched by adjusting the shortcircuit state or the non-shortcircuit state between the switch terminals 58 and 59 externally, thus allowing the output mode to be easily switched.

As the magnetic detection device 20 according to the embodiment is built in the electrical product, the electrical product is allowed to be operated in any one of the bipolar 1-output mode, the bipolar 2-output mode, and the single-pole 1-output mode. The magnetic detection devices adapted to the respective output modes required for the electrical product do not have to be produced. In other words, the magnetic detection device 20 may be commonly used, thus reducing the manufacturing cost compared with the case of the generally employed magnetic detection device.

Each layer structure and the curve R-H of the first magnetoresistive effect element 23 and the second magnetoresistive effect element 27 will be described in detail.

FIG. 7 is a sectional view illustrating each cross section of the first magnetoresistive effect element 23, the second magnetoresistive effect element 27, the first fixed resistance element 24, and the second fixed resistance element 28 which are assumed to be arranged in-line on the same substrate 80.

Referring to FIG. 7, each of the first magnetoresistive effect element 23 and the second magnetoresistive effect element 27 has a base layer 81, an antiferromagnetic layer 82, a fixed magnetic layer 83, a nonmagnetic material layer 84, a free magnetic layer 85 and a protection layer 86 sequentially laminated from the bottom.

The base layer 81 is formed of a nonmagnetic material which is selected as one or two kinds from the group including Ta, Hf, Nb, Zr, Ti, Mo and W. The antiferromagnetic layer 82 is formed of the antiferromagnetic material which contains an element α (α is one or two kinds selected from the group including Pt, Pd, It, Rh, Ru and Os) and Mn, or the antiferromagnetic material which contains the elements α and α' (α' is the element as one or two kinds selected from the group including Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth element) and Mn. For example, the antiferromagnetic layer 82 is formed of IrMn or PtMn. Each of the fixed magnetic layer 83 and the free magnetic layer 85 is formed of the magnetic material such as CoFe alloy, NiFe alloy and CoFeNi alloy. The nonmagnetic material layer 84 is formed of the nonmagnetic metal material, for example. Preferably, the nonmagnetic material layer 84 is formed of Cu. The protection layer 86 is formed of Ta and the like. The fixed magnetic layer 83 and the free magnetic layer 85 may have a laminated ferri structure (laminated structure of magnetic layer/nonmagnetic intermediate layer/magnetic layer having magnetic directions of two magnetic layers which interpose the nonmagnetic layer directed antiparallel). Each of the fixed magnetic layer 83 and the free magnetic layer 85 may have the laminated structure formed of different plural magnetic layers. The layer structure may be formed by laminating the base layer 80, the free magnetic layer 85, the nonmagnetic material layer 84, the fixed magnetic layer 83, the antiferromagnetic layer 82 and the protection layer 86 from the bottom.

Each of the first magnetoresistive effect element 23 and the second magnetoresistive effect element 27 has the antiferromagnetic layer 82 and the fixed magnetic layer 83 formed in contact with each other. Then the thermal process is performed in the magnetic field to form an exchange coupled magnetic field (Hex) on the interface between the antiferromagnetic layer 82 and the fixed magnetic layer 83 so as to fix the magnetizing direction of the fixed magnetic layer 83 to one direction. In FIG. 7, a magnetizing direction 83a of the fixed magnetic layer 83 is shown by an arrow direction. Each magnetizing direction 83a of the fixed magnetic layer 83 of the first magnetoresistive effect element 23 and the second magnetoresistive effect element 27 is indicated by X2 direction.

Meanwhile, the magnetizing direction of the free magnetic layer 85 in a zero-magnetic field state (state on which no external magnetic field is applied) is different between the first magnetoresistive effect element 23 and the second magnetoresistive effect element 27. As FIG. 7 shows, a magnetizing direction 85a of the free magnetic layer 85 of the first magnetoresistive effect element 23 is indicated by the X2 direction which is the same as the magnetizing direction 83a of the fixed magnetic layer 83. The magnetizing direction 85b of the free magnetic layer 85 of the second magnetoresistive effect element 27 is indicated by X1 direction which is antiparallel with respect to the magnetizing direction 83a of the fixed magnetic layer 83.

When the external magnetic field H in (+H) direction is applied, the magnetizing direction 85b of the free magnetic layer 85 of the second magnetoresistive effect element 27 does not fluctuate, and the magnetizing direction 85a of the free magnetic layer 85 of the first magnetoresistive effect element 23 fluctuates to change the resistance value of the first magnetoresistive effect element 23. FIG. 8 illustrates the curve R-H of the first magnetoresistive effect element 23. Referring to FIG. 8, as the external magnetic field H is gradually intensified from the zero-magnetic field state (no external magnetic field) toward the (+) direction, the parallel state between the magnetizing direction 85a of the free magnetic layer 85 and the magnetizing direction 83a of the fixed magnetic layer 83 collapses to approximate to the antiparallel state. Then the resistance value R of the first magnetoresistive effect element 23 gradually increases along a curve HR1. At this point, as the external magnetic field H in the (+) direction is gradually reduced toward zero, the resistance value R of the first magnetoresistive effect element 23 is gradually decreased along a curve HR2.

The curve R-H of the first magnetoresistive effect element 23 forms a loop L1 defined by the curves HR1 and HR2 in accordance with intensity change of the external magnetic field H in the (+) direction. The center value of the expanded width of the loop L1 as the intermediate value between the maximum and the minimum resistance values of the first magnetoresistive effect element 23 is a "midpoint" of the loop L1. The intensity of the magnetic field at the midpoint of the loop L1 determines magnitude of a first interlayer coupling magnetic field Hin1 applied between the free magnetic layer 85 and the fixed magnetic layer 83. Referring to FIG. 8, the first interlayer coupling magnetic field Hin1 of the first magnetoresistive effect element 23 shifts toward the (+) external magnetic field direction.

Meanwhile, when the external magnetic field H in the (−) direction is applied, the magnetizing direction 85a of the free magnetic layer 85 of the first magnetoresistive effect element 23 does not fluctuate, but the magnetizing direction 85b of the free magnetic layer 85 of the second magnetoresistive effect element 27 fluctuates to change the resistance value thereof.

FIG. 9 illustrates the curve R-H of the second magnetoresistive effect element 27. Referring to FIG. 9, as the external magnetic field H is gradually intensified from the zero-magnetic field state (no external magnetic field applied) to the (−) direction, the antiparallel state between the magnetizing direction 85b of the free magnetic layer 85 and the magnetizing direction 83a of the fixed magnetic layer 83 collapses to approximate to the parallel state. So the resistance value R of the second magnetoresistive effect element 27 gradually decreases along a curve HR3. As the external magnetic field in the (−) direction is gradually changed toward zero at the point, the resistance value R of the second magnetoresistive effect element 27 is gradually increased along a curve HR4.

The curve R-H of the second magnetoresistive effect element 27 forms a loop L2 defined by the curves HR3 and HR4 in accordance with the intensity change of the external magnetic field in the (−) direction. The center value of the expanded width of the loop L2 as the intermediate value between the maximum and the minimum resistance values of the second magnetoresistive effect element 27 is a "midpoint" of the loop L2. The intensity of the magnetic field at the midpoint of the loop L2 determines the magnitude of a second interlayer coupling magnetic field Hin2 applied between the free magnetic layer 85 and the fixed magnetic layer 83. Referring to FIG. 9, the second interlayer coupling magnetic field Hin2 of the second magnetoresistive effect element 27 shifts toward the (−) external magnetic field direction.

Assuming that the magnitude of the external magnetic field in the (+) direction is set to a positive value, and the magnitude of the external magnetic field in the (−) direction is set to a negative value, the first interlayer coupling magnetic field Hin1 is the positive value, and the second interlayer coupling magnetic field Hin2 is a negative value. In this way, the first and the second interlayer coupling magnetic fields Hin1 and Hin2 are reversely coded with positive/negative values.

Each material composition of the first magnetoresistive effect element 23 and the second magnetoresistive effect element 27 is made the same to set each TCR of those elements 23 and 27 to be substantially the same. Referring to FIG. 7, the film thickness of the nonmagnetic material layer 84 formed of Cu, for example, is made different between the first magnetoresistive effect element 23 and the second magnetoresistive effect element 27 to adjust the first interlayer coupling magnetic field Hin1 to the positive value and the second interlayer coupling magnetic field Hin2 to the negative value.

The film structure of the first fixed resistance element 24 connected to the first magnetoresistive effect element 23 in series is the same as that of the second fixed resistance element 28 connected to the second magnetoresistive effect element 27 in series.

In the embodiment shown in FIG. 7, each material composition of the first fixed resistance element 24 and the second fixed resistance element 28 is the same as that of the first magnetoresistive effect element 23 and the second magnetoresistive effect element 27. Unlike the first and the second magnetoresistive effect elements 23 and 27, the magnetic layer 87 and the nonmagnetic material layer 88 corresponding to the free magnetic layer 85 are inversely laminated.

Referring to FIG. 7, each of the first and the second fixed resistance elements 24 and 28 has the base layer 81, the antiferromagnetic layer 82, the fixed magnetic layer 83, the magnetic layer 87, the nonmagnetic material layer 88 and the protection layer 86 sequentially laminated from the bottom.

Each of the first and the second fixed resistance elements 24 and 28 has the fixed magnetic layer 83 and the magnetic layer 87 sequentially laminated on the antiferromagnetic layer 82. Magnetization of the fixed magnetic layer 83 and the magnetic layer 87 may be fixed by exchange coupling magnetic field (Hex) generated with the antiferromagnetic layer 82, and ferromagnetic coupling between the fixed magnetic layer 83 and the magnetic layer 87. The magnetic layer 87 formed of the same material as that of the free magnetic layer 85 in the magnetoresistive effect elements 23 and 27 does not fluctuate the magnetization to the external magnetic field unlike the free magnetic layer 85 thereof.

Each electric resistance value of the first fixed resistance element 24 and the second fixed resistance element 28 is not fluctuated by the external magnetic field.

This makes it possible to adjust each TCR of the first magnetoresistive effect element 23, the second magnetoresistive effect element 27, the first fixed resistance element 24 and the second fixed resistance element 28 to have substantially the same value.

The first fixed resistance element 24 and the second fixed resistance element 28 may have the single layer structure formed of the same material rather than the laminated structure as shown in FIG. 7.

Usage of the magnetic detection device 20 of bipolar detection type according to the embodiment will be described. The magnetic detection device 20 of the embodiment is installed in a folding mobile phone 100 of turn-over type.

Referring to FIG. 10, when the folding mobile phone 100 is opened, the magnetic detection device 20 detects opening of the mobile phone 100 in response to the intensity change in the external magnetic field applied to the magnetic detection device 20. The folding mobile phone 100 includes a first member 102 with a display screen and a second member 103 with an operation surface. In the state as shown in FIG. 10, a magnet 101 is positioned as illustrated by a plan view of FIG. 12. In this case, upon opening/closing of the folding mobile phone 100, the external magnetic field H in the (+) direction is applied from the magnet 101 to the magnetic detection device 20. When the folding mobile phone 100 is closed from the state shown in FIG. 10, the external magnetic field H in the (+) direction applied to the magnetic detection device 20 is gradually intensified. Then the differential potential exceeds the threshold level to generate the (+) magnetic detection signal, based on which the closing of the folding mobile phone 100 is detected.

The first member 102 of the mobile phone 100 is turned around the rotating axis at 180°. In the state shown in FIG. 10, a screen display 102*a* which has been an inner surface of the first member 102 is exposed as the outer surface shown in FIGS. 11 and 13. As shown in FIG. 13, the direction of the magnet 101 is inverted from the arrangement state shown in FIG. 12. Upon opening/closing of the folding mobile phone 100, the external magnetic field H in the (−) direction is applied from the magnet 101 to the magnetic detection device 20. When the folding mobile phone 100 is closed from the state shown in FIG. 11, the external magnetic field H in the (−) direction applied to the magnetic detection device 20 is gradually intensified. The differential potential exceeds the threshold level to generate the (−) magnetic field detection signal, based on which the closing of the folding type mobile phone 100 is detected.

In the case where the magnetic detection device 20 built in the folding mobile phone 100 is set in the bipolar 2-output mode as shown in FIG. 3, the (+) and (−) magnetic detection signals may be obtained and output separately. It may be determined whether or not the first member 102 is turned over when opening/closing the mobile phone. In the case where the folding mobile phone 100 is opened/closed without turning over the first member 102 as shown in FIGS. 10 and 12, turning ON/OFF of the backlight of the display screen upon the opening/closing is controlled. As shown in FIGS. 11 and 13, in the case where the first member 102 is turned over to open/close the folding mobile phone 100, the function other than the normal opening/closing detection, for example, the camera function may be activated.

In the bipolar 1-output mode shown in FIG. 2, the turn-over/non-turn-over of the first member 102 cannot be detected. However, even if any one of the magnetic detection device 20 and the magnet 101 is attached in the direction opposite the installation direction, the opening/closing detection may be enabled, thus improving workability of the assembly.

In the embodiment, besides the GMR element (gigantic magnetoresistive effect element) as described in FIG. 7 as the magnetoresistive effect element using the magnetoresistive effect which changes the electric resistance to the external magnetic field, the TMR element (tunnel type magnetoresistive effect element) and the AMR element (isotropic magnetoresistive effect element) may be used. Instead of the magnetoresistive effect element, the hall element may be employed. However, in the embodiment, it is preferable to use the GMR element or the TMR element to conduct high precision magnetic field detection.

What is claimed is:

1. A magnetic detection device comprising:
   a sensor unit which changes an electrical characteristic in accordance with change in each magnetic field intensity of external magnetic fields in (+) direction and (−) direction opposite the (+) direction; and
   an integrated circuit which is connected to the sensor unit for generating and outputting a (+) magnetic field detection signal and a (−) magnetic field detection signal based on the change in the electrical characteristic, wherein:
   the integrated circuit is provided with two output terminals and a mode switch circuit which includes a pair of switch terminals;
   the mode switch circuit is capable of switching between a 1-output mode for outputting the (+) and (−) magnetic field detection signals from one of the output terminals and a 2-output mode for outputting the (+) magnetic field detection signal from the one of the output terminal and the (−) magnetic field detection signal from the other output terminal, respectively depending on a shortcircuit state or a non-shortcircuit state between the switch terminals; and
   the shortcircuit state and the non-shortcircuit state are allowed to be externally adjusted.

2. The magnetic detection device according to claim 1, wherein the switch terminal is exposed on a surface of the device, and is adjusted into the shortcircuit state or the non-shortcircuit state based on an electrically coupled state or an electrically decoupled state between the switch terminals.

3. The magnetic detection device according to claim 1, wherein an operation member having a surface opposite the switch terminals formed of a conductive material is exposed on the surface of the device, and operated to adjust the switch terminals into the shortcircuit state via the operation member or the non-shortcircuit state having the operation member apart from the switch terminals.

4. The magnetic detection device according to claim 1, wherein the sensor unit includes a first circuit for detecting a (+) magnetic field, which is provided with a first magnetoresistive effect element using a magnetoresistive effect having an electric resistance changed based on the change in the magnetic field intensity of the external magnetic field in the (+) direction, and a second circuit for detecting a (−) magnetic field, which is provided with a second magnetoresistive effect element using the magnetoresistive effect having the electric resistance changed based on the change in the magnetic field intensity of the external magnetic field in the (−) direction.

5. An electrical product which contains the magnetic detection device according to claim 1, being formed to have one of a structure in which the magnetic detection device is adjusted to the 1-output mode, and an output terminal for outputting the (+) magnetic field detection signal and the (−) magnetic field detection signal is connected to a circuit substrate in the product, a structure in which the magnetic detection device is adjusted to the 2-output mode, and an output terminal for outputting the (+) magnetic field detection signal and the output terminal for outputting the (−) magnetic field detection signal are connected to the circuit substrate of the product, and a structure in which the magnetic detection device is adjusted to the 2-output mode, and only one of the output terminals for outputting the (+) magnetic field detection signal and the (−) magnetic field detection signal is connected to the circuit substrate in the product.

* * * * *